US012577670B2

(12) United States Patent
Lauffer

(10) Patent No.: US 12,577,670 B2
(45) Date of Patent: Mar. 17, 2026

(54) CVD REACTOR HAVING MEANS FOR LOCALLY INFLUENCING THE SUSCEPTOR TEMPERATURE

(71) Applicant: AIXTRON SE, Herzogenrath (DE)

(72) Inventor: Peter Sebald Lauffer, Aachen (DE)

(73) Assignee: AIXTRON SE, Herzogenrath (DE)

( * ) Notice: Subject to any disclaimer, the term of this patent is extended or adjusted under 35 U.S.C. 154(b) by 369 days.

(21) Appl. No.: 17/310,750

(22) PCT Filed: Feb. 10, 2020

(86) PCT No.: PCT/EP2020/053289
§ 371 (c)(1),
(2) Date: Aug. 20, 2021

(87) PCT Pub. No.: WO2020/169385
PCT Pub. Date: Aug. 27, 2020

(65) Prior Publication Data
US 2022/0106687 A1 Apr. 7, 2022

(30) Foreign Application Priority Data

Feb. 21, 2019 (DE) ..................... 10 2019 104 433.2

(51) Int. Cl.
*C23C 16/458* (2006.01)
*C23C 16/46* (2006.01)
*C23C 16/52* (2006.01)

(52) U.S. Cl.
CPC .......... *C23C 16/46* (2013.01); *C23C 16/4584* (2013.01); *C23C 16/52* (2013.01)

(58) Field of Classification Search
CPC ..... C23C 16/46; C23C 16/4584; C23C 16/52; C23C 16/466; H01L 21/67248
(Continued)

(56) References Cited

U.S. PATENT DOCUMENTS 5,155,336 A 10/1992 Gronet et al.
5,468,299 A 11/1995 Tsai
(Continued)

FOREIGN PATENT DOCUMENTS

DE 10064942 A1 7/2002
DE 10 2005 056 536 A1 5/2007
(Continued)

OTHER PUBLICATIONS

Written Opinion mailed Feb. 2, 2021, from ISA/European Patent Office, for International Patent Application No. PCT/EP2020/053289 (filed Feb. 10, 2020), English translation, 8 pgs.
(Continued)

*Primary Examiner* — Charlee J. C. Bennett
(74) *Attorney, Agent, or Firm* — Ascenda Law Group, PC

(57) ABSTRACT
In the thermal treatment of substrates, a susceptor is used to hold at least one substrate. The susceptor can be heated with a heater and driven in rotation about a rotation axis by a rotary drive. Means are provided to influence the heat transfer to or from the susceptor in a locally limited manner, synchronized with the rotary movement of the susceptor, to equalize local temperature differences on the rotating susceptor. In particular, a temperature control gas with changing heat conduction properties is periodically fed in a pulsed manner through a feed opening into a gap between the susceptor and a cooling unit.

13 Claims, 7 Drawing Sheets

(58) Field of Classification Search
USPC ......................................................... 118/725
See application file for complete search history.

(56) References Cited

U.S. PATENT DOCUMENTS

| | | | |
|---|---|---|---|
| 6,001,183 | A | 12/1999 | Gurary et al. |
| 8,249,436 | B2 | 8/2012 | Aderhold et al. |
| 8,288,288 | B1 | 10/2012 | Gage et al. |
| 2005/0011435 | A1* | 1/2005 | Dauelsberg ....... C23C 16/45519 |
| | | | 117/92 |
| 2005/0022741 | A1* | 2/2005 | Seo ..................... C23C 16/0272 |
| | | | 118/724 |
| 2008/0251020 | A1* | 10/2008 | Franken .............. C23C 16/4584 |
| | | | 118/730 |
| 2010/0170435 | A1* | 7/2010 | Franken .................. C23C 16/46 |
| | | | 118/666 |
| 2011/0020545 | A1* | 1/2011 | Kim .................... C23C 16/4584 |
| | | | 118/725 |
| 2012/0003389 | A1 | 1/2012 | Brein et al. |
| 2012/0149212 | A1* | 6/2012 | Strauch .............. C23C 16/4412 |
| | | | 257/E21.24 |
| 2012/0156396 | A1* | 6/2012 | Strauch .................. C23C 16/46 |
| | | | 118/724 |
| 2014/0287142 | A1* | 9/2014 | Boyd .................... C23C 16/455 |
| | | | 118/725 |
| 2015/0050819 | A1* | 2/2015 | Behdjat ................. H01L 21/324 |
| | | | 427/230 |
| 2016/0177441 | A1* | 6/2016 | Sabens ................ C23C 16/4583 |
| | | | 427/575 |
| 2017/0103907 | A1* | 4/2017 | Chu .................. H01J 37/32724 |
| 2018/0002830 | A1 | 1/2018 | Yudovsky et al. |
| 2018/0018263 | A1 | 1/2018 | Cho et al. |
| 2020/0095680 | A1* | 3/2020 | Satoh .................... C23C 16/466 |

FOREIGN PATENT DOCUMENTS

| | | | |
|---|---|---|---|
| DE | 10 2007 026 348 | A1 | 12/2008 |
| DE | 10 2009 043 960 | A1 | 3/2011 |
| DE | 10 2009 044 276 | A1 | 5/2011 |
| DE | 10 2011 053 498 | A1 | 3/2013 |
| DE | 10 2011 055 061 | A1 | 5/2013 |
| DE | 10 2013 109 155 | A1 | 2/2015 |
| DE | 102014104218 | A1 * | 10/2015 ......... C23C 16/4411 |
| DE | 10 2017 105 333 | A1 | 9/2018 |
| DE | 10 2017 105 947 | A1 | 9/2018 |

OTHER PUBLICATIONS

International Preliminary Report on Patentability issued Aug. 10, 2021, from The International Bureau of WIPO, for International Patent Application No. PCT/EP2020/053289 (filed Feb. 10, 2020), 19 pgs.

International Search Report mailed Feb. 2, 2021, from ISA/European Patent Office, for International Patent Application No. PCT/EP2020/053289 (filed Feb. 10, 2020), 12 pgs.

Written Opinion mailed Feb. 2, 2021, from ISA/European Patent Office, for International Patent Application No. PCT/EP2020/053289 (filed Feb. 10, 2020), 9 pgs.

Non-Final Office Action mailed Mar. 28, 2024, for U.S. Appl. No. 18/447,603, filed Aug. 10, 2023, 21 pgs.

Amendment filed Jun. 25, 2024, for U.S. Appl. No. 18/447,603, filed Aug. 10, 2023, 9 pgs.

Final Office Action dated Oct. 24, 2024, for U.S. Appl. No. 18/447,603, filed Aug. 10, 2023, 20 pgs.

Amendment filed Dec. 20, 2024, for U.S. Appl. No. 18/447,603, filed Aug. 10, 2023, 10 pgs.

Advisory Action dated Jan. 27, 2025, for U.S. Appl. No. 18/447,603, filed Aug. 10, 2023, 3 pgs.

Amendment filed Feb. 21, 2025, for U.S. Appl. No. 18/447,603, filed Aug. 10, 2023, 9 pgs.

Non-Final Office Action dated Jun. 6, 2025, for U.S. Appl. No. 18/447,603, filed Aug. 10, 2023, 21 pgs.

Amendment filed Sep. 4, 2025, for U.S. Appl. No. 18/447,603, filed Aug. 10, 2023, 12 pgs.

* cited by examiner

1

CVD REACTOR HAVING MEANS FOR LOCALLY INFLUENCING THE SUSCEPTOR TEMPERATURE

RELATED APPLICATIONS

This application is a National Stage under 35 USC 371 of and claims priority to International Application No. PCT/EP2020/053289, filed 10 Feb. 2020, which claims the priority benefit of DE Application No. 10 2019 104 433.2, filed 21 Feb. 2019.

FIELD OF THE INVENTION

The invention relates to a device for the thermal treatment of substrates with a susceptor for the reception of at least one substrate, which susceptor can be heated by a heater, and can be driven in rotation about an axis of rotation by a rotary drive.

The invention further relates to a method for the thermal treatment of substrates, in which a susceptor supports at least one substrate, is heated by a heater, and is driven in rotation about an axis of rotation.

BACKGROUND

U.S. Pat. No. 8,249,436 B2 describes a device and a method in which locally limited heat is supplied by means of a pulsed laser beam to a susceptor rotating about an axis of rotation.

Devices and methods of the type described above are also known in the art, for example from DE 10 2009 044 276 A1. A device of the type in question is embodied by a CVD reactor, which has a gas-tight housing, in which a process chamber is located. The floor of the process chamber is formed by a susceptor, which can be driven in rotation about an axis of rotation. On the susceptor are located substrate holders in a uniform peripheral distribution about a central gas inlet unit, each of which supports a substrate, and which is driven in rotation by a flow of purge gas and held in a floating state. The susceptor rotates above a heater, which is an induction coil that is cooled by means of a coolant. The temperature of the lower face of the susceptor is measured by a first pyrometer. The temperature of the substrates lying on the substrate holder is measured by a second pyrometer. The induction coil generates a high-frequency alternating field, which generates eddy currents within the susceptor, which is made of graphite, so that the susceptor can heat up to a process temperature. Due to manufacturing deficiencies, the material of the susceptor does not have a homogeneously distributed electrical conductivity, so that zones with low electrical conductivity and zones with high electrical conductivity form. The eddy currents induced in the susceptor are therefore locally opposed by different electrical resistances, so that the susceptor heats up locally in a different manner. In the case of an average temperature of 650° C. the temperature difference within the susceptor can be 5 to 8 K. It is a technological challenge to configure the lateral temperature profile on the susceptor upper face, on which the substrates are arranged, to be as homogeneous as possible.

From DE 10 2011 055 061 A1, a CVD reactor is known in the art, in which a gas mixture of a highly thermally conductive gas and a poorly thermally conductive gas can be fed into a gap between a heater and the lower face of a susceptor.

The following documents also belong to the prior art: DE 10 2005 056 536 A1, DE 10 2009 043 960 A1, DE 10 2011 053 498 A1, DE 10 2013 109 155 A1, DE 10 2014 104 218 A1, DE 10 2017 105 333 A1, US 2018/0182635 A1, and U.S. Pat. No. 5,468,229 A.

SUMMARY OF THE INVENTION

The object underlying the invention is that of the specification of measures, with which local temperature differences of the susceptor can be compensated.

The object is achieved by the invention specified in the claims, wherein the subsidiary claims represent not only advantageous developments of the invention specified in the respective independent claims, but also autonomous solutions of the object.

First and foremost, it is proposed that means are provided, with which the heat supply or heat removal, to or from the susceptor respectively, is periodically altered in a pulsed manner in at least one locally limited thermal influence zone. The means operate in a manner synchronized with the rotary movement of the susceptor. With the method according to the invention, the heat transport from or to the susceptor is locally limited, and is influenced in a manner synchronized with the rotary movement of the susceptor. The thermal influence zones are fixed in location with respect to the housing of the device. The azimuthal angular range over which a thermal influence zone extends is preferably less than the angular range about the center of rotation of the susceptor that is occupied by a substrate holder of the susceptor. The pulse duration, with which heat is supplied to, or removed from, the thermal influence zone of the rotating susceptor, is selected such that the heat is only transferred to the rotating susceptor at those locations that do not heat up sufficiently due to a locally higher electrical conductivity of the material of the susceptor, that is to say, at colder locations. The device has a control unit which interacts with an angle of rotation detector, with which the local angle of rotation of the susceptor can be detected. The control unit synchronises the thermal influence with the rotary movement of the susceptor, for example, such that the same location is always exposed to heat in the course of the individual rotations of the susceptor. The heat flow, which is stationary with respect to the housing, thus preferably acts on the same thermal influence zone of the susceptor with each rotation of the susceptor. In accordance with the invention, it is proposed that the thermal conductivity of a medium is periodically altered in the region of a thermal influence zone. In particular, provision is made for the medium to extend between the susceptor and a temperature control unit. It is particularly preferably proposed that, in the region of a thermal influence zone, the heat-conducting property of matter arranged between the susceptor and a cooling unit is periodically influenced in a pulsed manner, wherein the periodic duration is the time for one rotation of the susceptor, and the pulse width is less than the duration of the rotation. For this purpose, provision is made, in particular, for a gap to extend between the susceptor and the temperature control unit, through which a purge gas flows. One or a plurality of local feed openings can be provided in the gap, through which openings a temperature control gas is fed into the gap. A purge gas with a first thermal conductivity can constantly flow through the gap. A second purge gas, which has a different thermal conductivity from that of the first purge gas, is periodically fed through the feed opening in a pulsed, locally limited manner. In particular, provision is made for the first purge gas constantly flowing through the gap to be hydrogen, that is to say, a gas with a high thermal conductivity, and for nitrogen, that is to say, a gas with a lower thermal conductivity, to be fed through the feed opening. However, other pairs of gases, for example helium and argon, can also be used. The cooling unit is preferably formed by the liquid-cooled induction coil, with which the susceptor is heated. With the induction coil, which in particular is arranged spirally in a plane parallel to the plane of the extent of the susceptor, eddy currents are generated within the susceptor, which consists of graphite, or another heat-conducting material. The local magnitude of the eddy currents depends on the slightly alternating thermal conductivity of the material of the susceptor, so that the alternating electromagnetic field generated by the induction coil produces a locally varying energy flow in the susceptor, which results in local temperature differences. For the design of the above-mentioned gap, into which the temperature control gas is fed, a plate can be provided, which extends between the susceptor and the induction coil, with a small gap distance from a lower face of the susceptor. In the prior art, such a gap is provided so as to form a diffusion barrier. A purge gas flows through the gap from a radially inward location in the direction of a radially outward-arranged gas outlet unit, which prevents the process gas, which is fed into the process chamber arranged above the susceptor, from entering the region in which the induction coil is located. The temperature control gas is fed into this diffusion barrier formed by a constant gas flow. The flow velocity with which the purge gas flows through the gap is greater than the peripheral velocity of the susceptor at the height of the radially outer edge of the substrate holders. In particular, the flow of purge gas through the gap is so great that a complete gas exchange takes place in the gap when a susceptor passes over the thermal influence zone. Instead of a periodic switching-on of a temperature control gas, however, provision can also be made for a constant gas flow to pass through the feed opening, which, controlled by a valve, is a flow either of the first gas, or of the second gas. For this purpose, it is particularly advantageous if a gas line opens into the feed opening, into which line a gas with a high thermal conductivity, or a gas with a lower thermal conductivity, is fed as required under the control of a valve. In a development of the invention, it is proposed that a plurality of thermal influence zones are arranged in the peripheral direction about the center of the susceptor, which coincides with the axis of rotation of the susceptor. In combination therewith, or separately, however, provision can also be made for a plurality of thermal influence zones to be arranged one behind another in the radial direction, with respect to the center of rotation of the susceptor, wherein these thermal influence zones are either supplied with heat by radiant heaters, or are zones of variable thermal conductivity. In a development of the invention, provision can be made for the thermal influence zone to lie on a peripheral line, on which the substrate holders are located. The consequence of this is that only the radially outer region of the rotating substrate holder is influenced by the thermal influence zone, so that with this measure a temperature profile can also be adjusted on the substrate holder. Thus, in particular, provision is made that, with the means for influencing the heat transport, only the radially outer edge of the substrate holder is influenced. The temperature measurement points, with which the surface temperature of the susceptor can be measured, in particular on the lower face of the susceptor, can be arranged at different radial positions. In particular, provision is made for a temperature measurement point to be arranged radially inwards from, and radially outwards from, a thermal influence zone. In particular, provision is made for the surface temperature of the susceptor to be measured at the temperature measurement points with the aid of a pyrometer. In particular, provision is made for a fiber optic cable to be used for this purpose.

In accordance with one variant of the invention, which is autonomous in character, it is proposed that, for purposes of influencing the radial temperature profile of a substrate, which is supported by a substrate holder driven in rotation about a substrate holder axis of rotation, the thermal influence zone is radially offset with respect to an orbital path of the substrate holder axis of rotation about the center of the rotationally driven susceptor. Here, in particular, it is proposed that the thermal influence zone, with respect to the axis of rotation of the susceptor, lies radially inwards from the orbital path, or preferably, radially outwards from the orbital path. In particular, provision is made here for the medium whose heat conduction property is varied to be a gas, which is located between the susceptor and the temperature control unit, wherein an RF induction coil, cooled with a coolant, comes into consideration as the temperature control unit. In a further variant, provision is made for the thermal influence zone to lie exactly on the orbital path of the substrate holder axis of rotation. In these variants of the invention, the heat conduction property does not need to be periodically altered in a pulsed manner. In particular, it is advantageous if the substrate holder supports just one substrate, which has a circular shape, wherein the center of the substrate lies on the substrate holder axis of rotation. With these variants, a radial temperature profile of the substrate can be adjusted in a targeted manner. For purposes of influencing the thermal conductivity of the medium arranged between the susceptor and the temperature control unit, provision is, in particular, made for a temperature control gas to be fed into a gap between the susceptor and the temperature control unit, or between the susceptor and a plate arranged between the susceptor and the temperature control unit, through a gas outlet opening arranged radially outwards from the orbital path, arranged radially inwards from the orbital path, or arranged on the orbital path. Here provision can be made for the direction of flow of the temperature control gas to point away from the orbital path of the substrate holder axis of rotation in the radial direction. In the case of a gas outlet opening arranged radially outwards from the orbital path, the direction of flow is then in the radially outward direction. In the case of a gas outlet opening arranged radially inwards from the orbital path, the direction of flow is then directed radially inwards. However, it is also possible for the direction of flow to be directed radially outwards, with respect to the substrate holder axis of rotation, even if the gas outlet opening is arranged radially inwards from the orbital path.

BRIEF DESCRIPTION OF THE DRAWINGS

Example embodiments of the invention are explained in what follows with reference to the accompanying drawings. Here.

DETAILED DESCRIPTION

Figure 1:
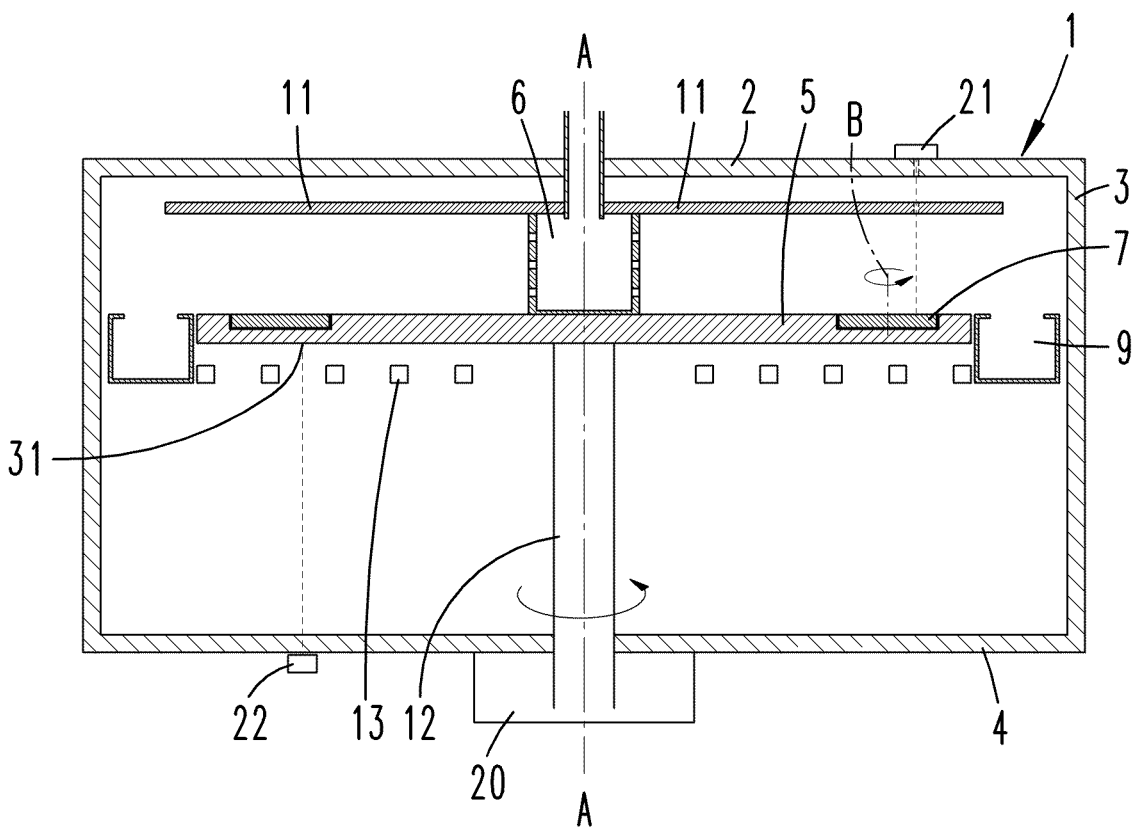
FIG. 1 shows a schematic longitudinal section of a CVD reactor with a susceptor 5 arranged therein.

A CVD reactor of the generic type (see FIG. 1) has a CVD reactor housing 1, which is gas-tight, can consist of stainless steel, and can have cooled walls. In particular, it has a cover 2, a side wall 3, which can be designed to be a circular cylinder in shape, and a floor 4 located opposite the cover 2. The cover 2, side wall 3, and floor 4 can be cooled.

With a gas inlet unit 6, process gases can be fed into a process chamber. The process chamber is bounded at the top by a process chamber ceiling 11, and at the bottom by a susceptor 5. The susceptor 5 is made of graphite, or another electrically conductive material, and can be driven in rotation about a support 12, about an axis A. A rotary drive 20 serves this purpose. Rotary encoders, which are not shown, are provided, with which the particular angular position of rotation of the susceptor 5 can be determined. The angle of rotation is communicated to a control unit, which is not shown.

Below the susceptor 5 is located a heater 13, which is designed as a liquid-cooled induction coil, with which an RF field is generated, which induces eddy currents within the susceptor 5, which currents lead to a heating of the susceptor to a process temperature. The process temperatures typically lie in the range between 600 and 1,000° C.

The upper face of the susceptor 5, facing towards the process chamber, has a multiplicity of pockets, arranged in the peripheral direction about the center of the susceptor 5, in each of which pockets there is a substrate holder 7, which on its upper face, facing towards the process chamber, supports a substrate, which can be coated with monocrystalline material by the introduction of process gases, for example organometallic compounds of the III-main group, and hydrides of the V-main group. The surface temperature of the substrates is measured with a first pyrometer 21. The process gas flows through the process chamber in a radially outward direction, and is removed by means of a gas outlet unit 9, which surrounds the susceptor 5 in an annular manner.

The surface temperature of the susceptor 5 is measured at a measurement point 31 by means of a second pyrometer 22. The temperature values measured by the first pyrometer 21 and the second pyrometer 22 are communicated to the control unit, which is not shown. A regulation unit is used to regulate the power fed into the induction coil 13, such that the substrate temperature, or the susceptor temperature, is maintained at a setpoint value.

The thermal energy fed into the susceptor 5 leaves the susceptor, either through the process chamber to the process chamber ceiling 2, or in a radial direction towards the side wall 3. However, the greatest heat flow from the susceptor

5 goes into the cooling water flowing through the induction coil 13. The induction coil 13, with its cooling channel 30, thus forms a cooling unit with which to extract heat from the susceptor 5.

Figure 2:
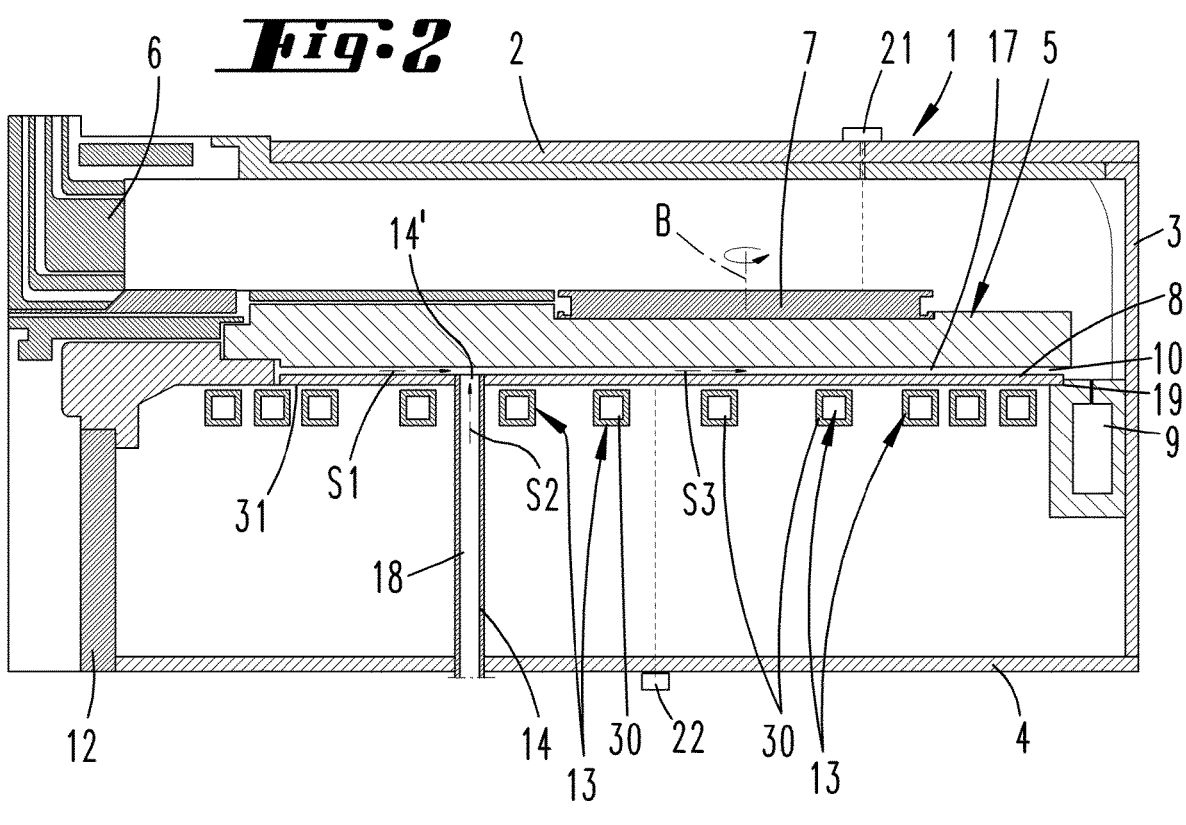
FIG. 2 shows an illustration in accordance with FIG. 1 of a first example embodiment of the invention with a susceptor 5.
Figure 3:
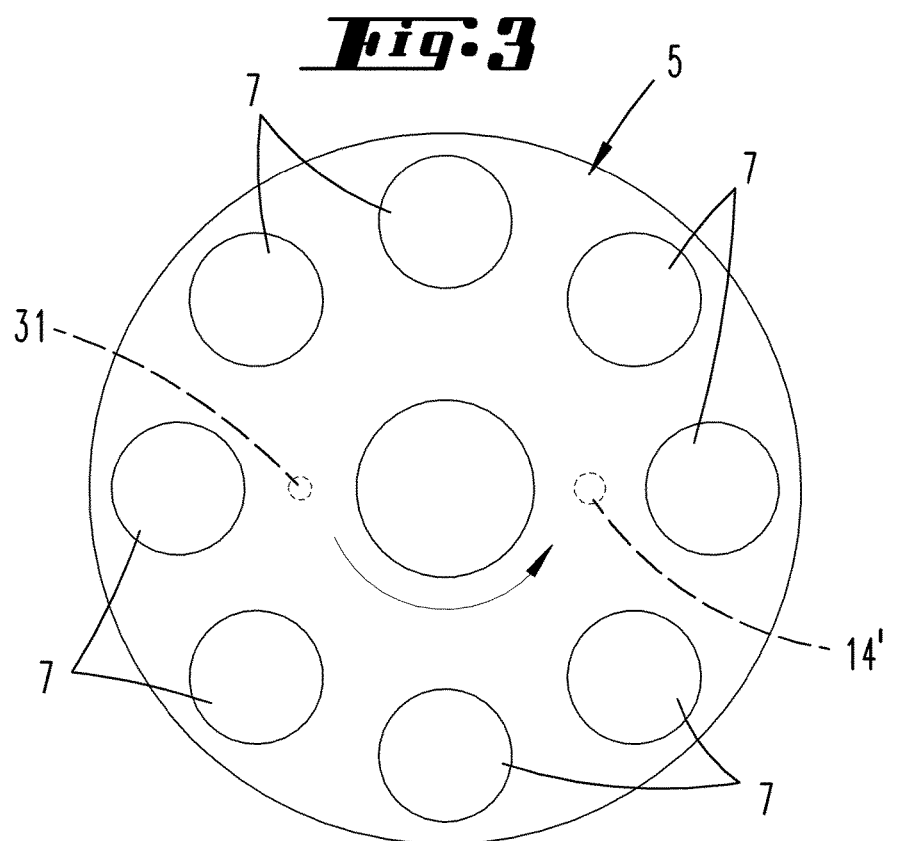
FIG. 3 shows a plan view onto the susceptor 5 of the first example embodiment of the invention.

In the example embodiment illustrated in FIGS. 2 and 3, a gap 10, through which gas can flow, is formed between the susceptor 5 and the heater 13, with the aid of a sealing plate 8, which is arranged below the susceptor 5. The radially outer edge of the sealing plate 8 is supported on a step 19 of the gas outlet unit 9. From radially inwards a first gas flow S1 can flow into the gap 10, forming a diffusion barrier that prevents process gas from entering the region of the reactor housing in which the induction coil 13 is located. Hydrogen is usually used for this purpose.

Figure 6:
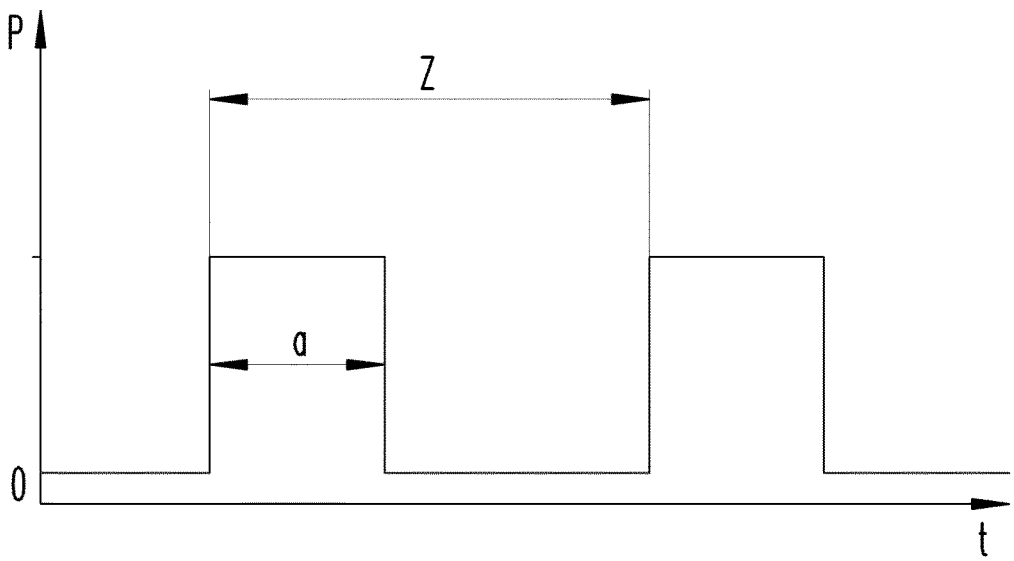
FIG. 6 shows the time profile of a periodically pulsed influence of the heat supply or heat removal on a thermal influence zone on the susceptor 5.

In at least one peripheral position, radially inwards from the peripheral zone in which the substrate holders 7 are located, a feed opening 14' is provided, into which a gas line 14 opens, with which a second gas flow S2 can be fed into the gap 10. Nitrogen is preferably used for this purpose. A nitrogen gas flow, pulsed as shown in FIG. 6, can be fed into the gap 10 by means of a valve, which is not shown, such that a temperature control gas, with a resistance to heat transfer that varies with time, flows through the gap 10 under the substrate holders 7 in a manner synchronized with the rotary movement of the susceptor 5. The gas flow S3 is formed by the two gas flows S1 and S2, and influences the heat transfer from the susceptor 5 to the cooling unit 30. The gas flow S2 is synchronized with the rotary movement of the susceptor 5 such that the nitrogen, as the gas flow S2, is only mixed with the hydrogen gas flow S1 if a particular substrate holder 7 of the plurality of substrate holders 7 moves over the angular region through which the gas flow S3 exhibiting the gas flow S2 flows. On account of the reduced thermal conductivity of nitrogen compared to hydrogen, less heat is extracted from the susceptor 5 under this substrate holder 7 than at the other locations of the other substrate holders 7. Local cold spots of the susceptor 5 can be compensated in this manner. In this variant, the thermal influence zone is located at a predetermined radial position with respect to the axis of rotation A of the susceptor 5, and at an azimuthal position, fixed relative to the housing, with respect to the substrate holder axis of rotation B. Since the thermal influence occurs in a manner synchronized with the rotation of the susceptor 5, the thermal influence zone 17 is also stationary with respect to the susceptor 5, because the heat transfer is always influenced on the same substrate holder 7.

Figure 4:
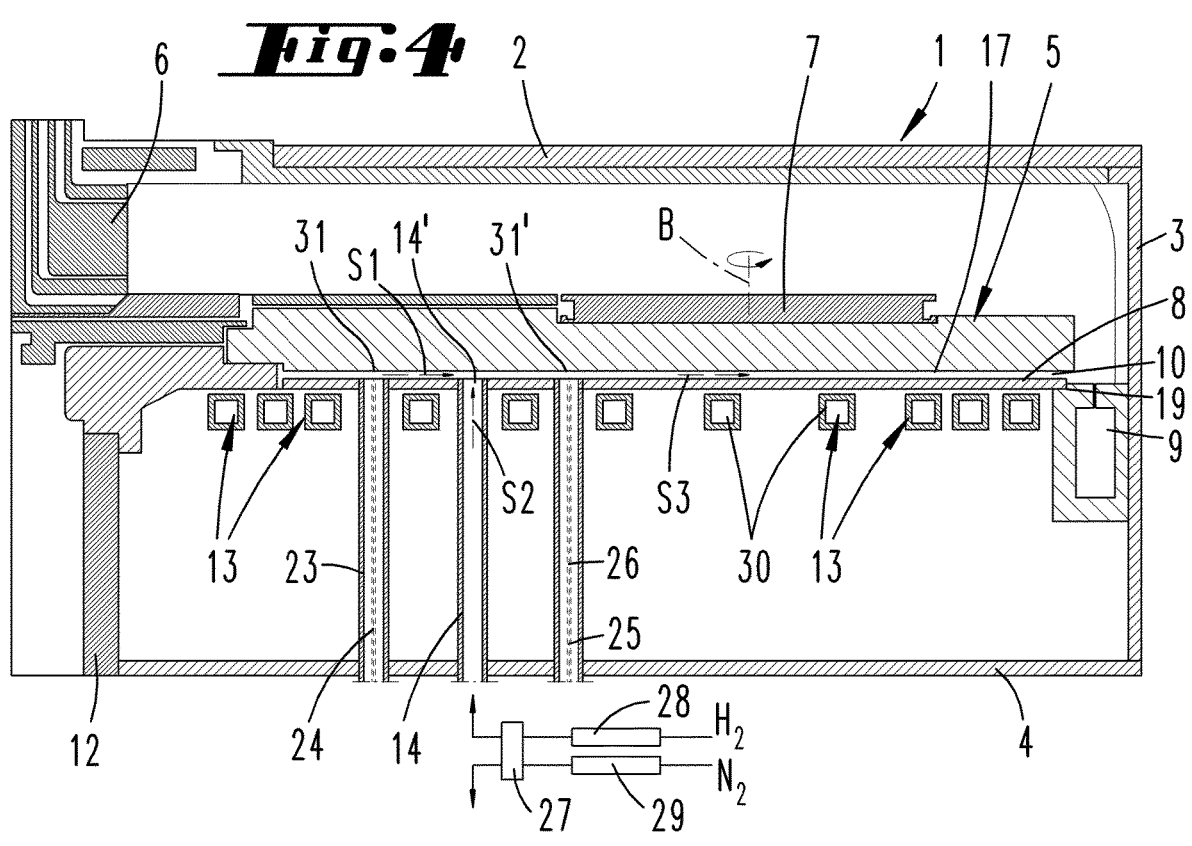
FIG. 4 shows an illustration in accordance with FIG. 1 of a second example embodiment of the invention.
Figure 5:
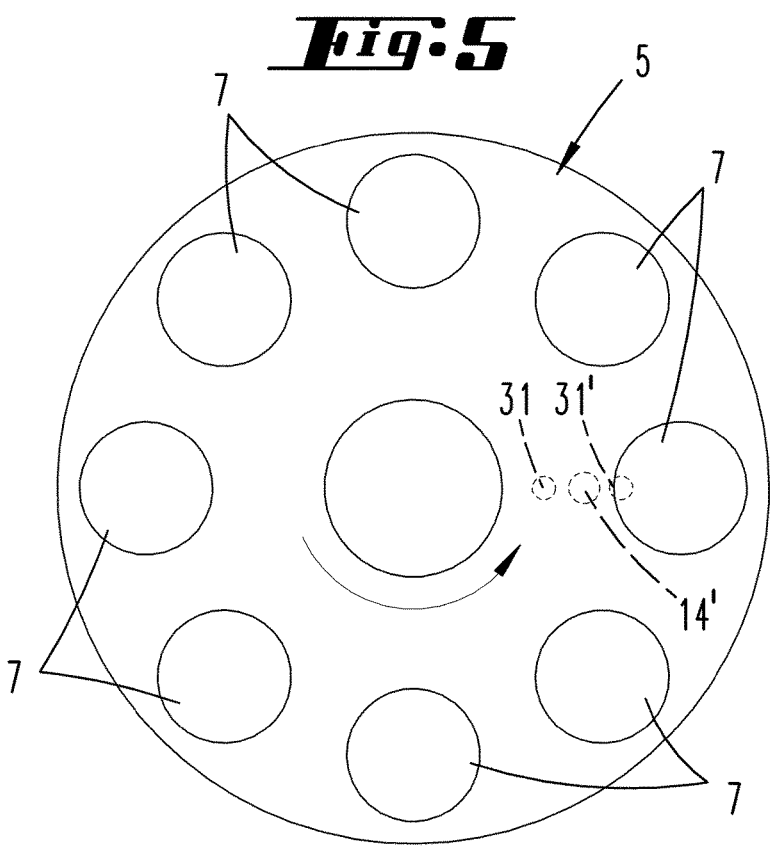
FIG. 5 shows a plan view onto the susceptor 5 of the second example embodiment of the invention.

FIGS. 4 and 5 show a second example embodiment of the invention. Here, provision is first made that hydrogen or nitrogen can be fed as required into the gas line 14 by means of a switching valve 27. The reference numerals 28 and 29 denote mass flow controllers, with which a nitrogen gas flow or a hydrogen gas flow can be adjusted. The valve 27 can take the form of a switching valve that directs the other gas flow into a "vent line".

The said valve arrangement can also be provided in the other example embodiments. However, provision can also be made for only one mass flow controller, which feeds a specific quantity of, e.g. nitrogen, as the second gas flow S2, into the gap 10.

In the second example embodiment illustrated in FIGS. 4 and 5, provision can also be made for the feed opening 14' to be located in an annular peripheral zone in which the substrate holders 7 are located, each of which is arranged, driven in rotation on a gas cushion, in pockets of the upper face of the susceptor 5. In particular, the feed opening 14' is offset radially outwards from the center of the substrate holder 7, so that only the temperature of the radially outer zone of the substrate holder 7 is influenced by the temperature control gas fed into the gap 10 and the gas flow S3 which is thereby formed. On account of the rotary movement of the substrate holder 7, the radially outer zone can here be temperature-controlled, and a temperature profile can thus be generated.

The flow velocity of the gas flow S3 in the example embodiments is sufficiently high such that the temperature of each substrate holder 7 can be individually influenced by means of correspondingly short pulses, and a multiplicity of pulses with possibly different pulse widths. For this purpose, the flow velocity of the gas flow S3 below the substrate holder 7 is preferably greater than the peripheral velocity of the susceptor according to that at the radially outer edge of the substrate holder 7, with respect to the axis of rotation A of the susceptor 5. Preferably, however, the flow velocity S3 is at least twice as great as the said peripheral velocity. The gas flow S3 is preferably about 20 cm/s.

FIG. 4 also shows two temperature measurement points 31, 31', wherein the temperature measurement point 31 is provided radially inwards from the feed opening 14', and the temperature measurement point 31' is provided radially outwards from the feed opening 14'. However, such an arrangement of two temperature measurement points 31, 31' can also be provided in the other example embodiments shown in FIGS. 2 and 3. In particular, provision is made that the temperatures at the measurement points 31, 31' are measured by means of pyrometers. For this purpose, fiber optic cables 24, 26 are led through pipes 23, 25, which are connected to pyrometers, which are not shown.

Figure 7:
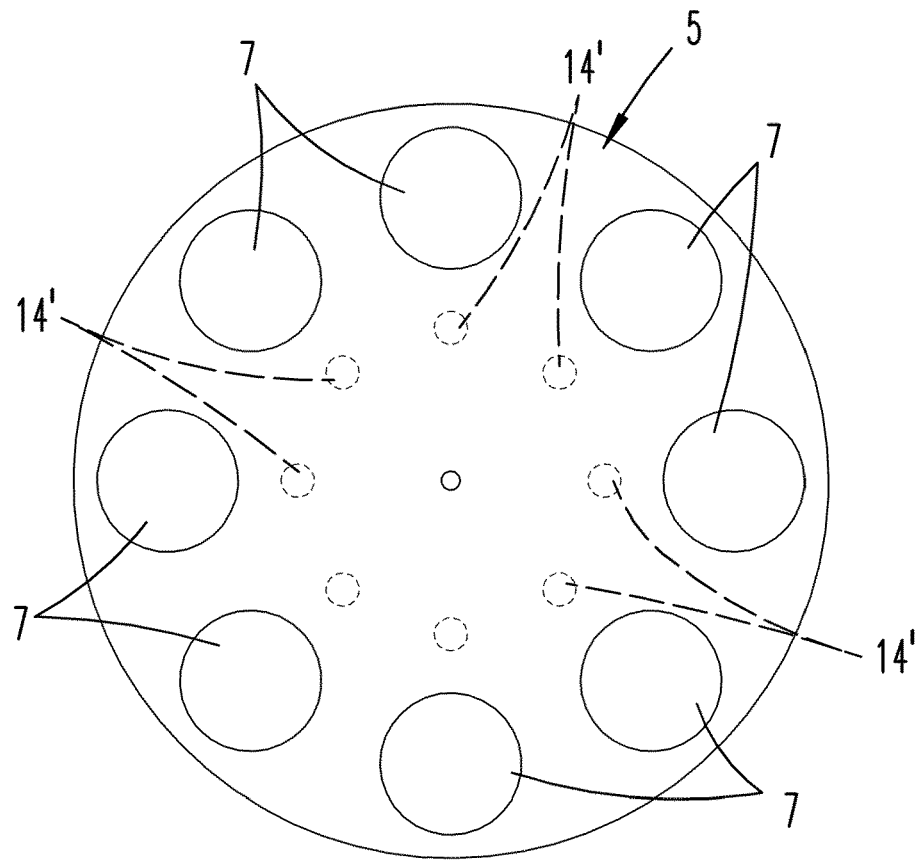
FIG. 7 shows an illustration in accordance with FIG. 2 of a third example embodiment of the invention.

In the third example embodiment illustrated in FIG. 7, a plurality of thermal influence zones, and in particular a plurality of feed openings 14', are arranged in the peripheral direction about the axis of rotation A of the susceptor 5, wherein the arrangement is uniformly distributed.

Figure 8:
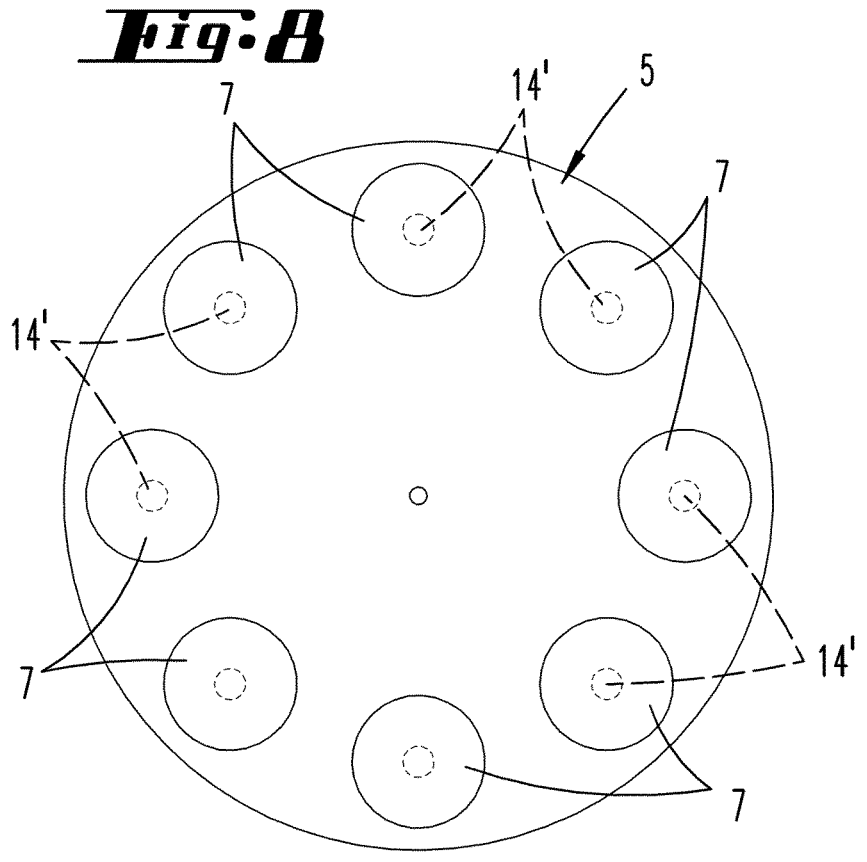
FIG. 8 shows an illustration in accordance with FIG. 2 of a fourth example embodiment of the invention.

The fourth example embodiment illustrated in FIG. 8 shows a plurality of thermal influence zones and feed openings 14', which are each arranged at radial positions that lie in the center of a peripheral zone in which the substrate holders 7 are located. In a variant of the example embodiment illustrated there, however, the feed opening 14' can also be arranged only under some of the substrate holders 7, or only under one of the substrate holders 7. Alternatively, the feed opening 14', which in the example embodiment illustrated in FIG. 8 is shown on an orbital path of the substrate holder axes of rotation, can be arranged radially offset from the latter. The feed opening 14' can thus be located radially inwards from, or radially outwards from, the orbital path, with respect to the center of the susceptor 5. The direction of flow of the temperature control gas emerging from the one or plurality of feed openings 14' can be directed both radially inwards and radially outwards with respect to the susceptor axis of rotation.

Figure 9:
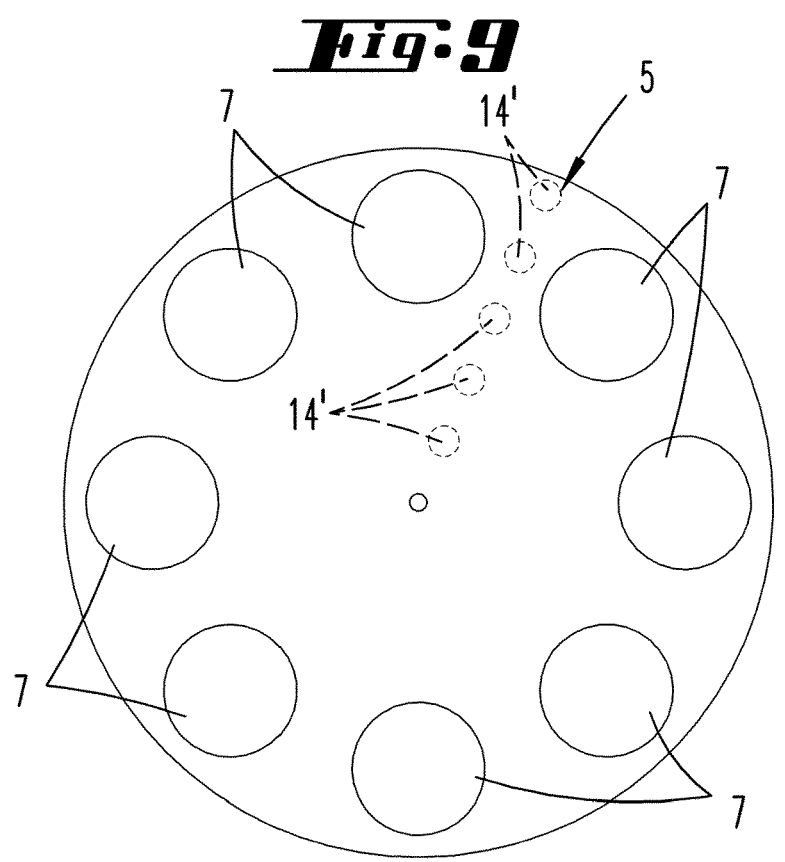
FIG. 9 shows an illustration in accordance with FIG. 2 of a fifth example embodiment of the invention.

In the fifth example embodiment illustrated in FIG. 9, a plurality of thermal influence zones and feed openings 14' are arranged one behind another in the radial direction. The feed openings 14' can be operated as required. The substrate holders 7 can be rotated about a substrate holder axis of rotation, and in particular each supports only one substrate in the shape of a circular disc. In this example embodiment, provision can be made for the gas flow of a temperature control gas exiting from the selected feed opening 14' to exit in a non-pulsed manner, that is to say, constantly, into an intermediate space between the lower face of the susceptor and the heater or cooling unit. In this variant, however, it is also possible to allow the temperature control gas to emerge from one or a plurality of the feed openings 14' in a pulsed manner, synchronized with the rotary movement of the susceptor. However, it is also possible to allow the gas to flow through the feed openings 14' in a non-pulsed manner. Different gas flow rates, and/or different types of gas, can also exit from the feed openings 14' in a pulsed, or a non-pulsed, manner. For this purpose, it is particularly advantageous if a plurality of feed openings 14' are arranged peripherally offset with respect to the center of the susceptor 5. Different gases, or mixtures of different gases, can also exit through the different feed openings 14' at different pulse rates.

Figure 10:
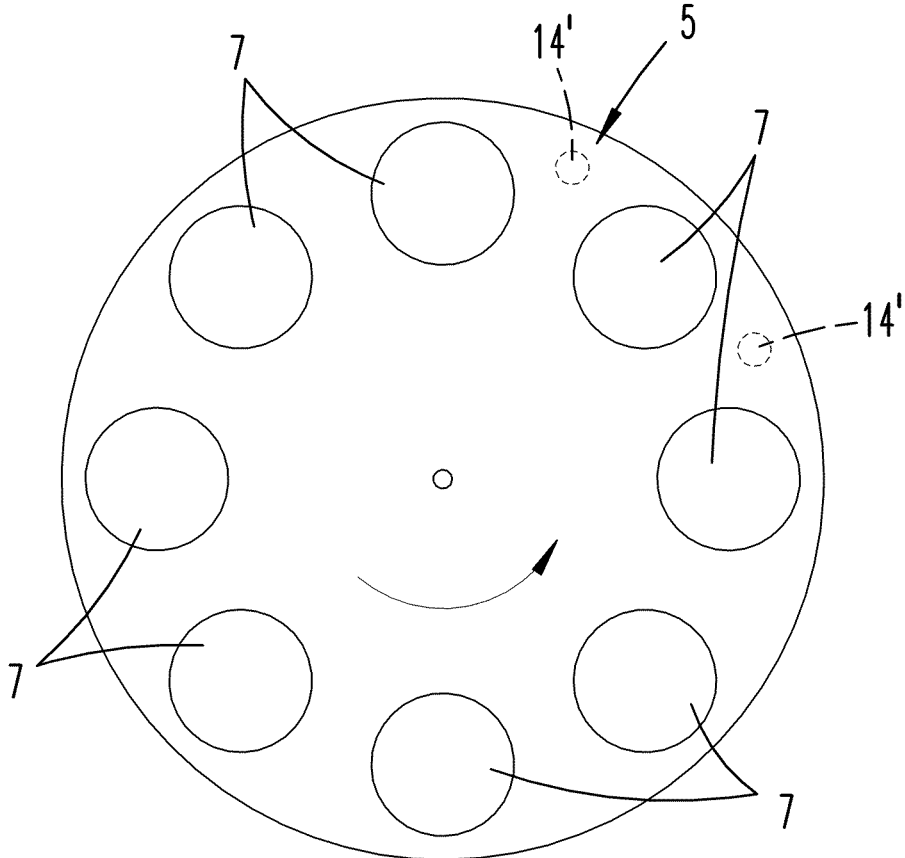
FIG. 10 shows an illustration in accordance with FIG. 2 of a sixth example embodiment of the invention.

In the sixth example embodiment illustrated in FIG. 10, a feed opening 14' is arranged in the radially outermost region of the peripheral zone in which the substrate holders 7 are located. Here the thermal influence zone and feed opening 14' can even be arranged radially outwards from the zone in which the substrate holders 7 are located.

At least one thermal influence zone 17 is limited to an angular range about the axis A. This azimuthal angular range is a maximum of 90, 60, or 45 degrees, or preferably a maximum of 30 degrees, 20 degrees, or a maximum of 15 degrees.

Figure 11:
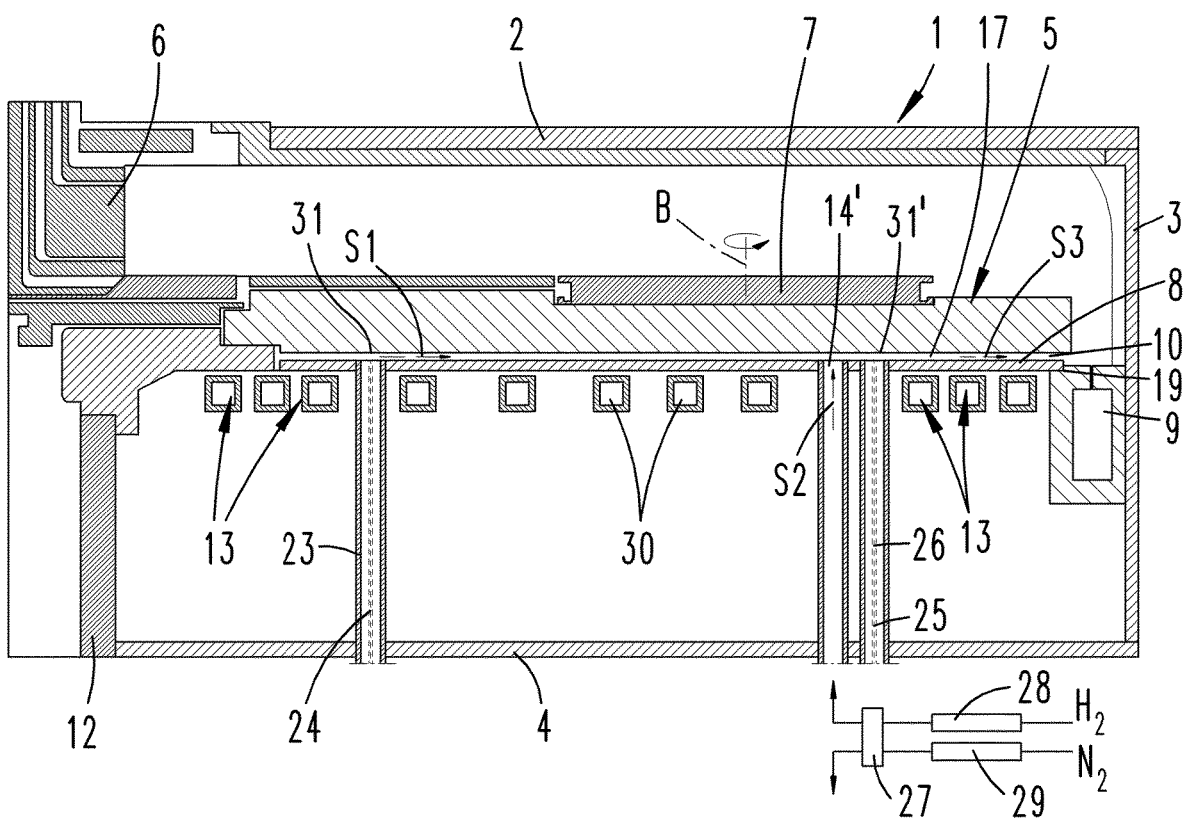
FIG. 11 shows an illustration of a further example embodiment in accordance with FIG. 4.

The example embodiment illustrated in FIG. 11 corresponds essentially to the example embodiment illustrated in FIG. 4, wherein here, however, provision is made for the feed opening 14' to lie radially outwards from a substrate holder axis of rotation B, about which the substrate holder 7 is driven in rotation. For this purpose, the substrate holder 7 lies on a gas cushion, which is fed with a rotational impulse into the intermediate space between the substrate holder 7 and the susceptor 5, such that the substrate holder 7 is caused to rotate. Here the substrate holder 7 preferably supports a substrate that is circular in shape. Here the center of the substrate and the axis of rotation B preferably coincide.

The gas flow that is fed into the gap 10 through the feed opening 14 flows through the gap 10 in the outward direction. Here the gas flow can also be fed in in a constant manner, or in a pulsed manner synchronized with the rotation of the susceptor 5.

A first gas flow S1, which can be nitrogen, for example, is fed into the gap 10 through the pipe 23, which can contain a fiber optic cable 24. With respect to the axis of rotation A of the susceptor 5, the pipe 23 is arranged radially inwards from an orbital path of the substrate holder axis of rotation B. In a region radially outwards from this orbital path is located the feed opening 14' for feeding a gas with a different thermal conductivity, for example hydrogen, so that in the radially outer region of the substrate holder 7 there is a different heat transport property in the gap 10 than that in the region of the center, in which the substrate holder axis of rotation B is located.

However, in one variant, which is not shown, the feed opening 14' can also be arranged radially inwards from the axis of rotation B of the substrate holder 7, and can lie closer to the axis of rotation A of the susceptor 5. The axis of rotation B of the substrate holder 7 describes within the reactor housing 1 an orbital circle about the axis of rotation of the susceptor 5. The feed opening 14' can also lie on this orbital path.

The above statements serve to explain the inventions covered by the application as a whole, which inventions in each case also independently further the prior art at least by means of the following combinations of features, wherein two, a plurality, or all, of these combinations of features can also be combined, namely:

A device, which is characterized in that the means periodically alter in a pulsed manner the thermal conductivity of a medium arranged between the susceptor 5 and a temperature control unit.

A method, which is characterized in that the heat conduction property of a medium arranged between the susceptor 5 and a temperature control unit is altered locally and periodically in a pulsed manner.

A device, which is characterized in that the thermal influence zone 17 is a region radially inwards from, or outwards from, or on, an orbital path of the substrate holder axis of rotation B about the susceptor axis of rotation A, with respect to the susceptor axis of rotation A.

A method, which is characterized in that the thermal influence zone 17 is a region radially inwards from, or outwards from, or on, an orbital path of the substrate holder axis of rotation B about the susceptor axis of rotation A, with respect to the susceptor axis of rotation A.

A device, or a method, which is characterized in that more heat is supplied to, or removed from, the susceptor at locally limited thermal influence zones 17, either periodically with the rotation time of the susceptor 5 for times shorter than the rotation time, or for times longer than the rotation time of the susceptor 5, than at regions of the susceptor 5 adjacent thereto, and in that the means are set up for this purpose.

A device, or a method, which is characterized in that the temperature control unit is a cooling unit 30, which in particular is formed by the cooling channel of an RF induction coil 13, wherein an electromagnetic alternating field is generated by the RF induction coil 13, which field induces eddy currents in the susceptor 5, made of an electrically conductive material, for purposes of heating the latter.

A device, or a method, which is characterized in that a temperature control gas is fed through a feed opening 14' into a gap 10 between the susceptor 5 and a temperature control unit, in particular a cooling unit 30, either periodically pulsed, or with a constant flow, wherein in particular provision is made for a temperature control gas with periodically changing thermal conductivity properties to be fed in, wherein provision is made in particular for a gas feed line 14 to open into the feed opening 14', into which a gas with a high thermal conductivity, or a gas with a lower thermal conductivity can be fed, or is fed, as required, by means of a switchover valve 28.

A device, or a method, which is characterized in that the gap 10 is formed by a sealing plate 8 arranged between the heater 13 and the lower face of the susceptor 5, through which passes a constant first gas flow S1 of a purge gas, into which first gas flow S1 a second gas flow S2 of a temperature control gas is fed, wherein the first gas flow S1 and the second gas flow S2 form a third gas flow S3 between a substrate holder 7 for purposes of supporting a substrate and a heater 13, the flow velocity of which is greater than the peripheral velocity of the susceptor 5 at the radially outer edge of the substrate holder 7.

A device, or a method, which is characterized in that a plurality of thermal influence zones 17 are provided, in which heat is periodically supplied or removed in a pulsed manner, wherein the thermal influence zones 17 are arranged at azimuthal angles that differ from one another, with respect to the center of the susceptor 5, and/or are arranged at different radial distances, with respect to the center of the susceptor 5.

A device, or a method, which is characterized in that at least one thermal influence zone 17, in which heat is periodically supplied or removed in a pulsed manner, is arranged in a peripheral region about the center of the susceptor 5, in which a plurality of substrate holders are located.

A device, or a method, which is characterized in that the thermal influence zone 17 is limited to an angular range about the axis A of a maximum of 90 degrees, 60 degrees, 45 degrees, 30 degrees, or 15 degrees.

A device, or a method, which is characterized by temperature measurement points 31, 31' arranged radially outwards from, and/or radially inwards from, a thermal influence zone for purposes of measuring the temperature of a surface of the susceptor 5.

A device, or a method, which is characterized in that the temperature control gas has a direction of flow directed radially inwards, or radially outwards, with respect to the susceptor axis of rotation A.

A device, or a method, which is characterized in that a plurality of feed openings 14' are provided at radial distances that differ from one another with respect to the susceptor axis of rotation A, wherein one or a plurality of temperature control gases can be fed as required through one or a plurality of feed openings 14'.

All disclosed features are essential to the invention (individually, but also in combination with each other). The disclosure of the application hereby also includes the full disclosure content of the associated/attached priority documents (copy of the previous application), also for the purpose of including features of these documents in the claims of the present application. The subsidiary claims, even without the features of a claim referred to, characterise with their features independent inventive developments of the prior art, in particular in order to make divisional applications on the basis of these claims. The invention specified in each claim can additionally have one or a plurality of the features specified in the above description, in particular those provided with reference numerals, and/or in the list of reference numerals. The invention also relates to forms of design, in which individual features cited in the above description are not realized, in particular to the extent that they can recognizably be dispensed with for the respective intended use, or can be replaced by other means having the same technical effect.

LIST OF REFERENCE SIGNS

1 Reactor housing
2 Cover
3 Side wall
4 Floor
5 Susceptor
6 Gas inlet unit
7 Substrate holder
8 Sealing plate
9 Gas outlet unit
10 Gap
11 Process chamber ceiling
12 Support
13 Heater
14 Gas line
14' Feed opening
17 Thermal influence zone
19 Step
20 Rotary drive
21 First pyrometer
22 Second pyrometer
23 Pipe
24 Fiber optic cable 25 Pipe
26 Fiber optic cable
27 Switching valve
28 Mass flow controller
29 Mass flow controller
30 Cooling channel
31 Temperature measurement point
31' Temperature measurement point
A Susceptor axis of rotation
B Substrate holder axis of rotation
S1 First gas flow
S2 Second gas flow
S3 Third gas flow
Z Rotation time
a Pulse width

What is claimed is:

1. A device for a thermal treatment of substrates, the device comprising:
 a housing (1);
 a radio frequency (RF) heater (13) being located in the housing (1);
 a rotary drive (20);
 a susceptor (5) that is heated by the RF heater (13), and is rotated about a first axis of rotation (A) by the rotary drive (20) with respect to the housing (1);
 a rotary encoder configured to determine an angular position of the susceptor (5);
 a control unit configured to receive the angular position from the rotary encoder;
 at least one substrate holder (7) disposed on the susceptor (5), the at least one substrate holder (7) for holding at least one substrate; and
 means (14, 14') for influencing a temperature of a first region of the susceptor (5), wherein the control unit is configured to control the means (14, 14') to influence a heat transfer from the susceptor (5) to a cooling unit (30) by altering, in a pulsed manner synchronized with a rotation of the susceptor (5), a thermal conductivity of a medium arranged between the susceptor (5) and the cooling unit (30) in a thermal influence zone (17), and wherein the thermal influence zone (17) is locally fixed in location with respect to the housing (1).

2. A device for a thermal treatment of substrates, the device comprising:
 a housing (1);
 a heater (13) being located in the housing (1);
 a rotary drive (20);
 a susceptor (5) that is heated by the heater (13) and is rotated about a first axis of rotation (A) by the rotary drive (20) with respect to the housing (1);
 a cooling unit (30) arranged below the susceptor (5);
 a rotary encoder configured to determine an angular position of the susceptor (5);
 a control unit configured to receive the angular position from the rotary encoder;
 at least one substrate holder (7), arranged eccentrically with respect to the first axis of rotation (A) on the susceptor (5), and which is rotated about a second axis of rotation (B) offset from the first axis of rotation (A), the at least one substrate holder (7) for holding at least one substrate; and
 means (14, 14') being controlled by the control unit for influencing a heat transfer from the susceptor (5) to the cooling unit (30) by altering a thermal conductivity of a medium in a first thermal influence zone (17) disposed radially inwards from, or outwards from, or on, an orbital path of the second axis of rotation (B) about the first axis of rotation (A), wherein the medium is arranged between the susceptor (5) and the cooling unit (30), and wherein the first thermal influence zone (17) is locally fixed in location with respect to the housing (1).

3. The device of claim 1, wherein the RF heater (13) comprises an RF induction coil (13), wherein the cooling unit (30) is formed by a cooling channel of the RF induction coil (13), and wherein an electromagnetic alternating field is generated with the RF induction coil (13), which field induces eddy currents in the susceptor (5), made of an electrically conductive material, for purposes of heating the susceptor (5).

4. The device of claim 2, wherein the first thermal influence zone (17) is part of a plurality of thermal influence zones (17), in which heat is periodically supplied or removed in the pulsed manner synchronized with the rotation of the susceptor (5), and wherein the plurality of thermal influence zones (17) are arranged at azimuthal angles that differ from one another, with respect to a center of the susceptor (5), and/or are arranged at different radial distances, with respect to the center of the susceptor (5).

5. The device of claim 2, wherein the first thermal influence zone (17), in which heat is periodically supplied or removed in the pulsed manner synchronized with the rotation of the susceptor (5), is arranged in a peripheral region of the susceptor (5), in which a plurality of substrate holders (7) are located.

6. The device of claim 2, wherein the first thermal influence zone (17) is limited to an angular range about the first axis of rotation (A) of a maximum of 90 degrees.

7. The device of claim 2, further comprising temperature measurement points (31, 31') arranged radially outwards from, and/or radially inwards from, the first thermal influence zone (17), for purposes of measuring a temperature of a surface of the susceptor (5).

8. The device of claim 2, wherein the heater (13) comprises a radio frequency (RF) induction coil (13), wherein the cooling unit (30) is formed by a cooling channel of the RF induction coil (13), and wherein an electromagnetic alternating field is generated with the RF induction coil (13), which field induces eddy currents in the susceptor (5), made of an electrically conductive material, for purposes of heating the susceptor (5).

9. The device of claim 1, further comprising:
 a sealing plate (8) disposed between the RF heater (13) and the susceptor (5); and
 a gap (10) between the sealing plate (8) and the susceptor (5),
 wherein the medium is a gas that is flowed into the gap (10).

10. The device of claim 2, further comprising:
 a sealing plate (8) disposed between the heater (13) and the susceptor (5); and
 a gap (10) between the sealing plate (8) and the susceptor (5),
 wherein the medium is a gas that is flowed into the gap (10).

11. The device of claim 9, further comprising:
 a sealing plate (8) disposed between the susceptor (5) and the cooling unit (30),
 wherein the sealing plate (8) extends over a portion of a radial length of the susceptor (5),
 wherein a diffusion barrier is located within the gap (10), the diffusion barrier extending from radially inwards over an entire length of the gap (10) to a gas outlet unit (9), and wherein the diffusion barrier is formed by a first gas flow (S1) with a first thermal conductivity which flows from radially inwards over the entire length of the gap (10) to the gas outlet unit (9).

12. The device of claim 11, wherein a radially outer edge of the sealing plate (8) is supported on a step (19) of the gas outlet unit (9) so that the gas flowing through the gap (10) is prevented from entering a region of the housing (1) below the sealing plate (8), and wherein in at least one peripheral position, radially inwards from a peripheral zone in which the at least one substrate holder (7) is located, the sealing plate (8) has at least one feed opening (14') into which a gas line (14) opens, with which a second gas flow (S2) having a second thermal conductivity, which is different from the first conductivity, is fed into the gap (10).

13. The device of claim 12, wherein the control unit is configured to control the first gas flow (S1) and the second gas flow (S2) in such a way that the thermal conductivity of the medium in a portion of the thermal influence zone (17) extending within the gap (10), between the at least one feed opening (14') and the gas outlet unit (9), changes in the pulsed manner synchronized with the rotation of the susceptor (5).

\* \* \* \* \*